METHOD OF MANUFACTURING SEMICONDUCTOR DEVICES

Filed April 3, 1968

INVENTORS
MARTIN B. BAKKER
STANLEY A. SWEARINGEN
BY Percy P. Lantzy
ATTORNEY

United States Patent Office 3,535,773
Patented Oct. 27, 1970

3,535,773

METHOD OF MANUFACTURING SEMICONDUCTOR DEVICES

Martin B. Bakker, Lawrence, and Stanley A. Swearingen, Salem, Mass., assignors to International Telephone and Telegraph Corporation, Nutley, N.J., a corporation of Delaware

Filed Apr. 3, 1968, Ser. No. 718,523
Int. Cl. B01j *17/00;* H01l *5/00, 7/66*
U.S. Cl. 29—580 7 Claims

ABSTRACT OF THE DISCLOSURE

This disclosure is for a method of making semiconductor devices which have a glass layer over the silicon dioxide layer and provides an improved means for separating the semiconductor wafer into dice.

BACKGROUND OF THE INVENTION

This invention relates to semiconductor devices and more particularly to a method of scribing the wafer to facilitate breaking the wafer into dice.

One of the most important factors in semiconductor device performance is the condition of the semiconductor surface. This affects the reliability of the device over a long period of time which, in turn, is dependent upon maintenance of the original surface condition under all conditions of temperature and possible contaminating influences. The accepted method to obtain optimum surface conditions and to preclude the deposition of contamination of any substance that might change the characteristics of the semiconductor body is to protect the surface and more particularly the p-n junction which occurs to the surface by a coating of dielectric such as silicon dioxide. Prior to the use of silicon dioxide, there was used silicon oil or grease, silicon varnishes, and alkyd-silicon combination resins. It was found, however, that silicon dioxide alone is often insufficient to prevent deleterious results on the p-n junction and surface of the semiconductor wafer by contaminating substances because silicon dioxide among other things is somewhat porous. It was then proposed to utilize a layer of glass fused over the oxide layer which is noncontaminating and which closely matches the coefficient of expansion of the semiconductor. The device after being thus passivated is then encapsulated and provided with necessary leads to facilitate the use thereof. Semiconductor devices with portected p-n junctions and the techniques for protecting them with silicon dioxide films and glass coatings chemically bonded thereof are disclosed and claimed in the U.S. Pats. 3,247,428; 3,300,841; and 3,323,956. However, after the glass is fused, there is the problem of scribing the wafer in order to facilitate breaking the wafer into dice. It would be necessary to scribe through the glass and scratch the silicon dioxide layer beneath; the difference in hardness of the glass and the silicon dioxide presents problems. One way of doing this is to etch away the glass along the scribe lines; but this is expensive and time consuming.

It is an object of this invention to provide a method for removing the glass from the vicinity of the scribe lines in order to facilitate the subsequent scribing process which is simple and economical.

SUMMARY OF THE INVENTION

This invention provides for a method of making semiconductor devices, such as diodes, transistors, integrated circuits, where the silicon dioxide or other passivating dielectric is covered with an additional protective layer of glass after the complete diffusion and metallizing processes have been done on the semiconductor wafer. The improvement herein consists in plowing channels or moats in the glass frit along which subsequently the scribing lines are to be made to facilitate the breaking of the wafer into chips or dice.

DESCRIPTION OF THE INVENTION

This invention will be more clearly understood by reference to the accompanying drawings, in which.

Figure 1:
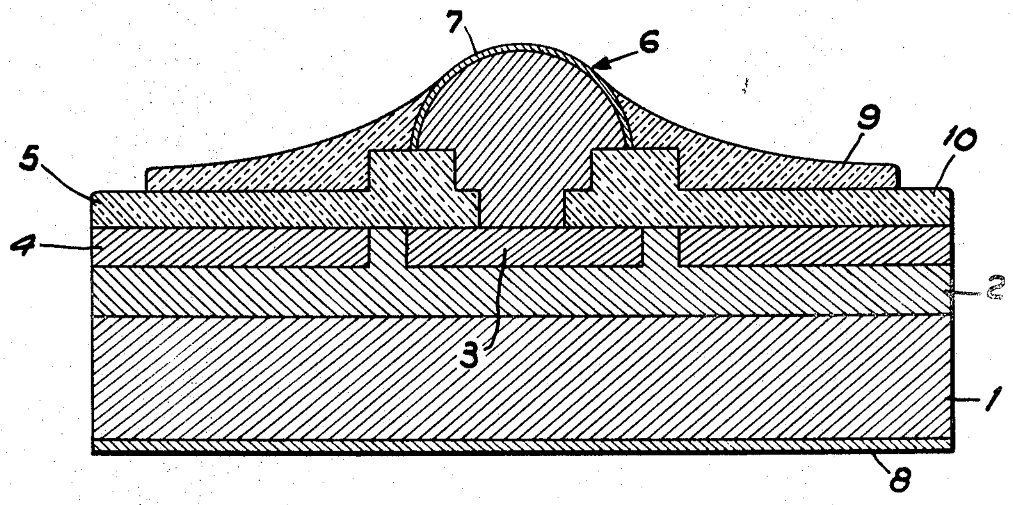
FIG. 1 shows a semiconductor diode.

With reference to FIG. 1, a typical diode is shown having a substrate 1 of N+ conductivity, an N diffused or epitaxial region 2, and a P region 3 constituting the p-n junction therein. This diode also shows an N+ region 4 diffused in the N region 2 around the P region 3 for isolation purposes. Covering the surface of the chip with the exception of the metal contact area is the silicon dioxide layer 5. The metal contact 6 ordinarily comprises a preliminary metallizing layer of gold on the surface of the P region 3 and a silver dot 7 in the shape of a somewhat hemispherical ball electroplated to the metal layer. The silver dot 7 is nickel plated to prevent migration of silver ions into the glass layer. The back contact 8 is plated on the bottom surface and can, for example, be tin coated silver. It is to be understood that the diffusion steps and the metallizing steps including the silver dot 7 are performed, in accordance with standard techniques, over the whole semiconductor wafer. After the diffusion, passivating and metallizing steps are complete, there is deposited over the whole surface of the wafer a layer 9 of glass frit in the form of a very fine powder which is centrifuged in accordance with known techniques to deposit uniformly over the whole surface. The glass is removed from the tops of the silver dots prior to firing by moving the wafer over a silk screen. It is also known to remove the glass from the silver dots by etching away the glass after firing. Subsequently the wafer is then placed in a furnace and fired at a temperature of about 640° C. for about nine minutes in order to fuse the glass layer. The glass that can be used in the process of this invention can be glass referred to in Pat. 3,300,841, Corning 7040, a glass manufactured by Corning Glass Works or any other suitable glass which will fuse at a low temperature and has thermal expansion characteristics matching very closely those of silicon semiconductor material.

Figure 2:
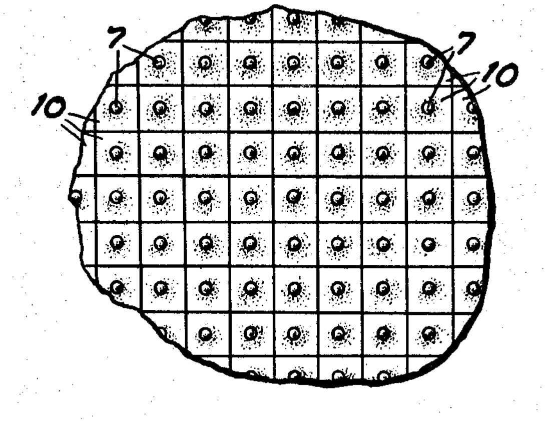
FIG. 2 shows a portion of the semiconductor wafer with the channels plowed therein.

However, if the glass were fired over the whole surface, then the subsequent scribing process to break the wafer into dice would produce defects. Scribing through the fused glass layer and the silica passivating layer would create difficulties with regard to the proper tool, geometry and composition because of the different hardnesses of the two layers. In addition, the glass being brittle would not be separated on clear and distinct lines but would have ragged edges and would not provide the protection desired from the second passivating layer. This invention then provides for the step prior to fusing the glass and after the deposition of the glass layer on the wafer to wipe or plow channels or moats in the glass frit along the lines where the subsequent and final scribing operation will take place. The channels or moats thus scribed removes only the glass from the area of the channels. This can be clearly seen with reference to FIG. 1 where the glass layer 9 is shown covering all of the chip with the exception of a small area on the silver dot 7 and the area 10 along the periphery of the semiconductor chip. It is to be understood that this area 10 extends along all four sides of the periphery of the chip. The tool for plowing the moat is of a hardness sufficient to remove the glass 9 but not hard enough to penetrate the silicon dioxide layer 5. FIG. 2 shows a portion of the semiconductor wafer which includes a plurality of semiconductor dice of FIG. 1 with the silver dot 7 showing in the center of each die and the plowed channels 10 therein.

After the channels 10 are plowed in the semiconductor wafer, the wafer is placed in a furnace and heated at the temperature and for the time described above. Then the wafer is removed from the furnace and in accordance with known techniques the wafer is scribed along the center of channels 10 to penetrate the silicon dioxide layer 5 and is then broken into the component dice.

While we have described above the principles of our invention in connection with specific apparatus, it is to be clearly understood that this description is made only by way of example and not as a limitation to the scope of our invention as set forth in the objects thereof and in the accompanying claims.

We claim:

1. The method of making semiconductor devices comprising the steps of:

diffusing an impurity of one type conductivity into a semiconductor substrate of opposite type conductivity to form a plurality of regions of said one type conductivity and rectifying junctions in said substrate and at one surface of said substrate;

covering said surface of said substrate with a first dielectric material;

producing contacts on said diffused areas;

covering said surface of said substrate with a second dielectric material, removing said second dielectric material from said contacts on said surface of said substrate, forming channels in said second dielectric material to divide said surface into a plurality of semiconductor devices;

placing said substrate in a furnace to fuse said second dielectric material, scribing said substrate along said channels; and breaking said substrate along the scribe lines to produce a plurality of semiconductor devices.

2. The method of making semiconductor devices according to claim 1 wherein said semiconductor devices are diodes.

3. The method of making semiconductor devices according to claim 1 wherein said first dielectric material is silicon dioxide.

4. The method of making semiconductor devices according to claim 1 wherein said second dielectric material is glass.

5. The method of making semiconductor devices according to claim 4 wherein said glass having a low melting point and a coefficient of expansion matching the coefficient of expansion of silicon dioxide.

6. The method of making semiconductor devices according to claim 4 wherein the depths of said channels are equivalent to the thickness of said glass material.

7. The method of making semiconductor devices according to claim 6 wherein said channels are formed with a tool which has a hardness greater than that of the unfused glass material but less than said silicon dioxide.

References Cited

UNITED STATES PATENTS

| | | | |
|---|---|---|---|
| 2,970,730 | 2/1961 | Schwarz | 225—2 |
| 3,323,956 | 6/1967 | Gee | 148—177 |
| 3,392,440 | 7/1968 | Yanagawa | 29—580 |
| 3,396,452 | 8/1968 | Sato et al. | 29—583 |

JOHN E. CAMPBELL, Primary Examiner

W. TUPMAN, Assistant Examiner

U.S. Cl. X.R.

29—583; 148—1.5, 186; 225—2